United States Patent [19]

Dryburgh

[11] 4,172,754
[45] Oct. 30, 1979

[54] SYNTHESIS OF ALUMINUM NITRIDE

[75] Inventor: Peter M. Dryburgh, Dalkeith, Scotland

[73] Assignee: National Research Development Corporation, London, England

[21] Appl. No.: 925,590

[22] Filed: Jul. 17, 1978

[51] Int. Cl.² ............................................. C01B 21/06
[52] U.S. Cl. ................................... 156/613; 156/614; 156/DIG. 99; 423/412; 423/509
[58] Field of Search .................. 423/409, 412, 509; 156/613, 614, DIG. 99

[56] References Cited

U.S. PATENT DOCUMENTS

| | | | |
|---|---|---|---|
| 3,598,526 | 8/1971 | Huml et al. ........................... | 156/614 |
| 3,607,046 | 9/1971 | Little et al. .......................... | 423/412 |
| 3,922,475 | 11/1975 | Manasevit ..................... | 156/DIG. 99 |
| 3,933,573 | 1/1976 | Dugger ......................... | 156/DIG. 99 |

Primary Examiner—Earl C. Thomas
Attorney, Agent, or Firm—Pollock, Vande Sande & Priddy

[57] ABSTRACT

Solid aluminum nitride, deposited for example, in epitaxial layers, is prepared by reacting aluminum and selenium to form aluminum monoselenide, and transporting the aluminum monoselenide in an inert carrier gas to a heated deposition zone where it is contacted with and reacts with nitrogen to give the aluminum nitride, the carrier gas flushing away elemental selenium also produced in the deposition zone.

10 Claims, 1 Drawing Figure

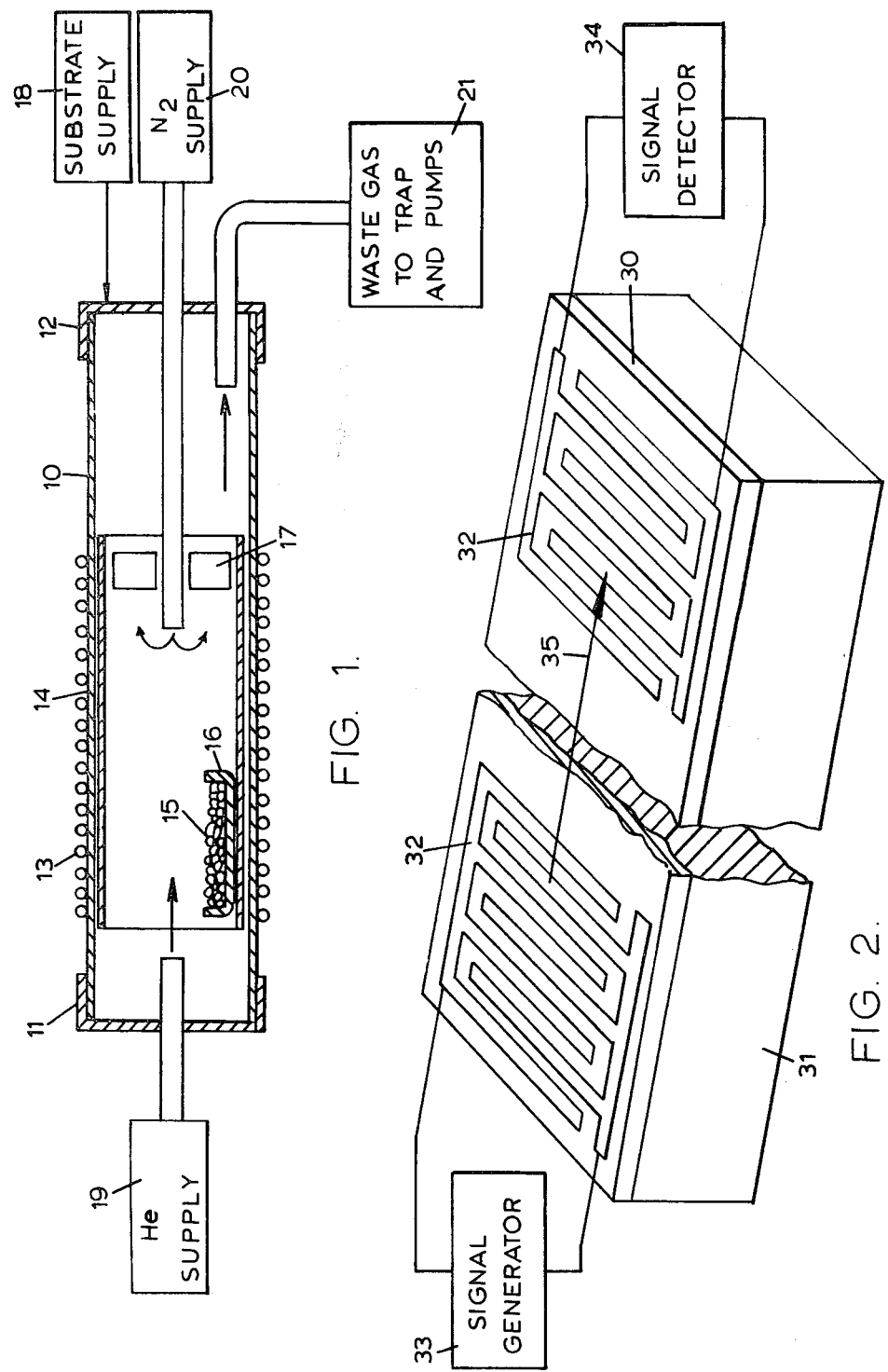

SYNTHESIS OF ALUMINUM NITRIDE

The present invention is concerned with a process for the production of aluminum nitride, with its adaptation to the production of epitaxial crystalline layers suitable for surface acoustic wave (SAW) devices, single crystals of aluminum nitride and to such crystalline layers and crystals.

Aluminum nitride is a refractory material. It does not sublime appreciably at normal pressures until the temperature is in the range 2000° to 2450° C. and it also has useful electrical properties notably as a thin film insulator and as a piezoelectric material of high surface-acoustic-wave (SAW) velocity.

Several processes are known for the production of aluminum nitride of which the most important for the production of material for SAW devices are the halide process and the organo-metallic process.

In the prior art process ammonia and aluminum trichloride react in the gas phase in a multi-stage reaction to produce overall solid aluminum nitride and gaseous hydrogen chloride. This process has the disadvantage that aluminum trichloride is very hygroscopic and difficult to handle and the resulting aluminum nitride films tend to be subject to hydrolysis.

In the prior art organo-metallic process the ammonia is reacted in the gaseous phase again in stages with aluminum trimethyl to yield overall aluminum nitride solid and gaseous methane. The disadvantage of this process is that as simple organo-metallic compounds tend to be unstable the final reaction stage tends to be homogeneous resulting in the deposition of aluminum nitride powder on the growing layer of aluminum nitride. Aluminum trimethyl is also a dangerous material to handle and difficult to purify by distillation.

Despite these problems the organo-metallic process has tended to give the most useful results heretofore.

It is an object of the present invention to provide a process for the production of aluminum nitride employing more readily purified starting materials and more thermally stable reaction intermediates than the prior art processes.

In accordance with the present invention a process for the production of aluminum nitride includes the steps of causing aluminum and selenium to react to form aluminum monoselenide, transporting the gaseous aluminum monoselenide in an inert carrier gas to a heated deposition zone within which it is contacted and reacts with nitrogen gas to form solid aluminum nitride and gaseous elemental selenium, the latter being flushed away by the inert carrier gas.

It is believed that as a first step aluminum and selenium react to form the expected aluminum tri-selenide $Al_2Se_3$ and that further reaction takes place in the two stages set forth below:

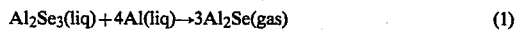

$$Al_2Se_3(liq) + 4Al(liq) \rightarrow 3Al_2Se(gas) \quad (1)$$

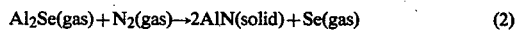

$$Al_2Se(gas) + N_2(gas) \rightarrow 2AlN(solid) + Se(gas) \quad (2)$$

As the gaseous aluminum monoselenide is evolved it is entrapped in the inert carrier gas and carried to the heated deposition zone in which the reaction set forth in equation (2) takes place. It is to be understood that the foregoing explanation is not to be construed as limiting in any way upon the scope of the invention.

Although the reaction will take place with a wide range of relative molar proportions of the two reactants aluminum and selenium, it has been found that the preferable proportions are two molar proportions of aluminum to one molar proportion of selenium.

For the purposes of the present invention the term "inert gas" means a gaseous material which does not react with any of the starting materials, products, apparatus construction materials of the process disclosed in the specification, and advantageously an inert gas is one of the so called noble gases of group VIII of the periodic table, the preferred inert gas being helium.

The relative flow rates of the inert gas and the nitrogen must be carefully adjusted to ensure heterogeneous decomposition of the aluminum selenide on the substrate for the most efficient operation of the process. In general the optimum relative flow rates must be determined by trial and error because the exact dimensions of the reaction tube affect the flow patterns of the reacting gases and thus the relative flow rates required for optimum operation. If the flow rate of the inert gas is too low relative to the flow rate of nitrogen there is excessive back diffusion of nitrogen to the aluminum selenide source causing a passivation reaction leading to slowing of the rate of production of aluminum selenide, which in turn results in very low deposition rates of aluminum nitride. If the inert gas flow rate is too high the aluminum selenide tends to be carried too fast through the heated deposition zone which result again in slow deposition rates of aluminum nitride.

The process of the present invention may be used to produce bulk single crystals of aluminum nitride or the aluminum nitride may be deposited as epitaxial crystalline layers upon appropriate substrates. For example, single crystal aluminum oxide or silicon carbide may be placed in the aluminum nitride deposition zone in order to obtain films of aluminum nitride upon the substrate.

It has been found convenient to combine the aluminum/selenium reaction zone and the heated deposition zone into a single reaction tube and the temperature of the heated reaction zone must be controlled so as to avoid deleterious reactions or effects. It must be above about 1500° C. because of the need to prevent condensation of aluminum tri-selenide which may be formed by the disproportionation of aluminum monoselenide. The upper limit is set by the need to avoid chemical reaction between the substrate upon which the aluminum nitride is being deposited and one or more of the chemical species present before, during or after the production of aluminum nitride. For example if aluminum nitride is being deposited on alumina the temperature must be kept below about 1600° C. in order to prevent the formation of an oxynitride spinel phase.

In accordance with an aspect of the present invention a process for the production of an epitaxial film of aluminum nitride upon an alumina substrate includes placing a slice of single crystal aluminum oxide having a desired crystallographic surface orientation in the heated aluminum nitride deposition zone of a process as hereinbefore defined. Preferably the crystallographic orientation of the single crystal slice of aluminum oxide is $1\overline{1}00$ (hereinafter designated M-plane), and in accordance with a preferred aspect of the present invention an epitaxial film of aluminum nitride is deposited by the process hereinbefore defined upon a slice of single crystal aluminum oxide oriented so that the crystal face which is presented has the crystallographic orientation $1\overline{1}00$.

The process of the present invention will now be described by way of example only with reference to the accompanying drawings of which:

FIG. 1 is a general schematic flow sheet of the process, and

FIG. 2 is a simple interdigital transducer which can be made on the aluminum nitride film produced by the present process.

Turning now to FIG. 1 the reaction is carried out in a silica tube 10 having aluminum end caps 11 and 12 and provided with a RF coil 13 by which energy is provided to a susceptor 14 by means of which the necessary heat is supplied to the reactants. The term "susceptor" is a well-known term of art for a material which is heated by generation of eddy currents therein when RF radiation from a nearby source falls on it, graphite being a commonly used susceptor material. The original solid reactants 15 are contained in a carbon boat 16. One end 12 of the silica tube 10 is enclosed within a laminar air flow clean station (not shown) so that the substrates 17 can be subjected to final cleaning in clean room conditions as they pass from the substrate supply 18 to the apparatus.

A helium supply 19, controlled and purified by conventional means (not shown), passes through one aluminum end cap 11, and a nitrogen supply 20, also controlled and purified by conventional means (not shown), passes through the other aluminum end cap 12, through which exhaust gases are withdrawn to waste 21 and collected by conventional means (not shown).

The process is controlled by monitoring the temperature within the silica tube 10 by means of a thermocouple (not shown) and the temperature profile along the silica tube can be altered by changing the RF coil in accordance with known practice.

For the best results the starting materials should be of the highest purity available. For example, the nitrogen used is generally of electronic grade.

In order to operate the process, aluminum and selenium powders of high purity are weighed out in the proportion of two molar parts of aluminum to one of selenium, thoroughly mixed mechanically and pressed into pellets in a PTFE (polytetrafluoroethylene) lined die. The pellets are placed in the carbon boat 16 which is then put in place. The substrates, which are single crystal slices of aluminum oxide oriented so that the surface displays the $1\bar{1}00$ crystallographic orientation produced by standard methods, are cleaned in hydrogen peroxide/hydrochloric acid mixtures and placed in the apparatus.

In a typical example of the process a total gas (that is helium plus nitrogen) flow rate is about 2 liters per minute of which up to a half, that is 1 liter per minute is nitrogen, and the reactor temperature is 1550° C. Once the reactor reaches the operation temperature the reaction is allowed to proceed for a period of 6 hours and deposits a layer of epitaxial aluminum nitride of one to three microns thickness. At the end of this time the reactor is cooled at a rate of 10° C. per minute to prevent damage to the apparatus caused by thermal shock.

The epitaxial films of aluminum nitride upon aluminum oxide are sufficiently smooth to permit the deposition thereon of metal films by standard methods of photolithography.

The epitaxial film of aluminum nitride can have a pattern of conducting films deposited on it by conventional photolithographic means to produce a SAW device such as the simple uniform interdigital transducer illustrated in FIG. 2, which shows an epitaxial film of aluminum nitride 30 carried upon a substrate of single crystal aluminum oxide 31, the aluminum oxide surface being in the crystallographic orientation $1\bar{1}00$. The film of aluminum nitride 30 carries a pattern of two interdigital electrodes 32. A signal source 33 is connected across one end of the electrodes 32 and a signal detector 34 across the other.

When an alternating voltage is applied to the electrodes 32 by the signal source 33 a surface acoustic wave is generated and travels along the device in the direction of the arrow 35 and is detected by the signal detector 34. The characteristics of the surface wave are determined by the size and spacing of the interdigital electrodes 32 and by the frequency of the applied signal. By suitable adjustment of these parameters this simple device can act as a filter.

It will of course be realised that the SAW device of FIG. 2 is purely illustrative and that many devices well known within the SAW art can be produced.

I claim:

1. A process for the production of aluminum nitride including the steps of heating aluminum and selenium at a temperature at which they react together to form aluminum monoselenide, transporting aluminum monoselenide so formed in an inert carrier gas to a reaction zone heated at a temperature in the order of 1500° C., at which aluminum monoselenide reacts with nitrogen to yield aluminum nitride, introducing nitrogen into said zone together with said aluminum monoselenide to form solid aluminum nitride, and flushing away elemental selenium produced by said reaction in said zone by said inert gas.

2. A process as in claim 1 and wherein said inert gas is a noble gas.

3. A process as in claim 1 and wherein said inert gas is helium.

4. A process as in claim 1 and wherein said nitrogen is supplied to said reaction zone with said inert gas.

5. A process as in claim 4 wherein the rate of flow of said inert gas is about 1 liter per minute and the rate of flow of said nitrogen is about 1 liter per minute.

6. A process as in claim 1 wherein the temperature of said reaction zone is about 1550° C.

7. A process as in claim 1 wherein said aluminum nitride is deposited epitaxially on a substrate.

8. A process as in claim 7 and wherein said substrate is aluminum oxide.

9. A process as in claim 1 wherein said aluminum and selenium are in the relative molar proportions of 2 to 1.

10. The process of claim 1 wherein said reaction of aluminum and selenium and said reaction of aluminum monoselenide and nitrogen take place in a single reaction vessel, the temperature of said vessel being in the range 1500° C. to 1600° C.

* * * * *